United States Patent
Carlough et al.

(10) Patent No.: US 9,543,963 B2
(45) Date of Patent: Jan. 10, 2017

(54) MODULO-M BINARY COUNTER

(71) Applicant: International Business Machines Corporation, Armonk, NY (US)

(72) Inventors: Steven R. Carlough, Poughkeepsie, NY (US); Adam B. Collura, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 161 days.

(21) Appl. No.: 14/609,526

(22) Filed: Jan. 30, 2015

(65) Prior Publication Data

US 2016/0226494 A1    Aug. 4, 2016

(51) Int. Cl.
| | | |
|---|---|---|
| H03K 23/00 | (2006.01) | |
| H03K 23/58 | (2006.01) | |
| H03K 23/66 | (2006.01) | |
| H03K 23/64 | (2006.01) | |
| H03K 21/38 | (2006.01) | |
| H03K 23/40 | (2006.01) | |

(52) U.S. Cl.
CPC ............ H03K 23/005 (2013.01); *H03K 21/38* (2013.01); *H03K 23/40* (2013.01); *H03K 23/58* (2013.01); *H03K 23/588* (2013.01); *H03K 23/64* (2013.01); *H03K 23/667* (2013.01)

(58) Field of Classification Search
None
See application file for complete search history.

(56) References Cited

U.S. PATENT DOCUMENTS

| | | | |
|---|---|---|---|
| 5,249,148 A | 9/1993 | Catherwood et al. | |
| 5,440,705 A | 8/1995 | Wang et al. | |
| 5,499,299 A | 3/1996 | Takenaka et al. | |
| 6,269,138 B1 * | 7/2001 | Hansson | H03K 23/58 377/116 |
| 7,219,198 B2 | 5/2007 | Sivaram et al. | |
| 7,243,118 B2 | 7/2007 | Lou | |
| 8,458,444 B2 | 6/2013 | Chou et al. | |
| 2003/0169841 A1 * | 9/2003 | van der Valk | H03K 23/665 377/115 |
| 2004/0083251 A1 | 4/2004 | Geiringer et al. | |
| 2009/0146699 A1 * | 6/2009 | Casagrande | H03K 23/667 327/115 |
| 2014/0215190 A1 | 7/2014 | Mylius et al. | |

OTHER PUBLICATIONS

Parker, et al.; "Modular Arithmetic Using Low Order Redundant Bases"; IEEE Transactions on Computers; vol. 46. No. 5; May 1997.

* cited by examiner

*Primary Examiner* — Tuan T Lam
(74) *Attorney, Agent, or Firm* — Edward J. Wixted, III (57) ABSTRACT

An input value, where the input value is an amount which the current value of the counter is to be increased is received. The current value of the modulo binary counter and an offset value of the modulo binary counter are increased by the input value. Whether the current value of the counter is greater than or equal to the modulus value of the binary counter is determined. The current value of the counter is replaced with an updated offset value of the counter, where the updated offset value is the offset value of the counter increased by the input value. The updated offset value of the counter is returned.

20 Claims, 3 Drawing Sheets

MODULO-M BINARY COUNTER

BACKGROUND OF THE INVENTION

The present invention relates generally to the field of counter management and more particularly to binary counters.

Traditionally, modulo binary counters are implemented by making the modulus value a power of two such as 1, 2, 4, 8, 16, 32, etc. This is done so that when the counter fills up with data and overflows, the value wraps back to zero due to the nature of binary counters which can only store a finite number of bits of data. When the value of each bit in the counter becomes a value of one, no larger values can be stored by the counter, and when the counter is increased again, the value wraps back to zero as a result. The value at which the counter wraps back to a value of zero is referred to as the modulus value for the counter.

SUMMARY

Embodiments of the present invention disclose a method, computer program product, and computer system for implementing a modulo binary counter. An input value, where the input value is an amount which the current value of the counter is to be increased is received. The current value of the modulo binary counter and an offset value of the modulo binary counter are increased by the input value. Whether the current value of the counter is greater than or equal to the modulus value of the binary counter is determined. The current value of the counter is replaced with an updated offset value of the counter, where the updated offset value is the offset value of the counter increased by the input value. The updated offset value of the counter is returned.

DETAILED DESCRIPTION

Figure 1:
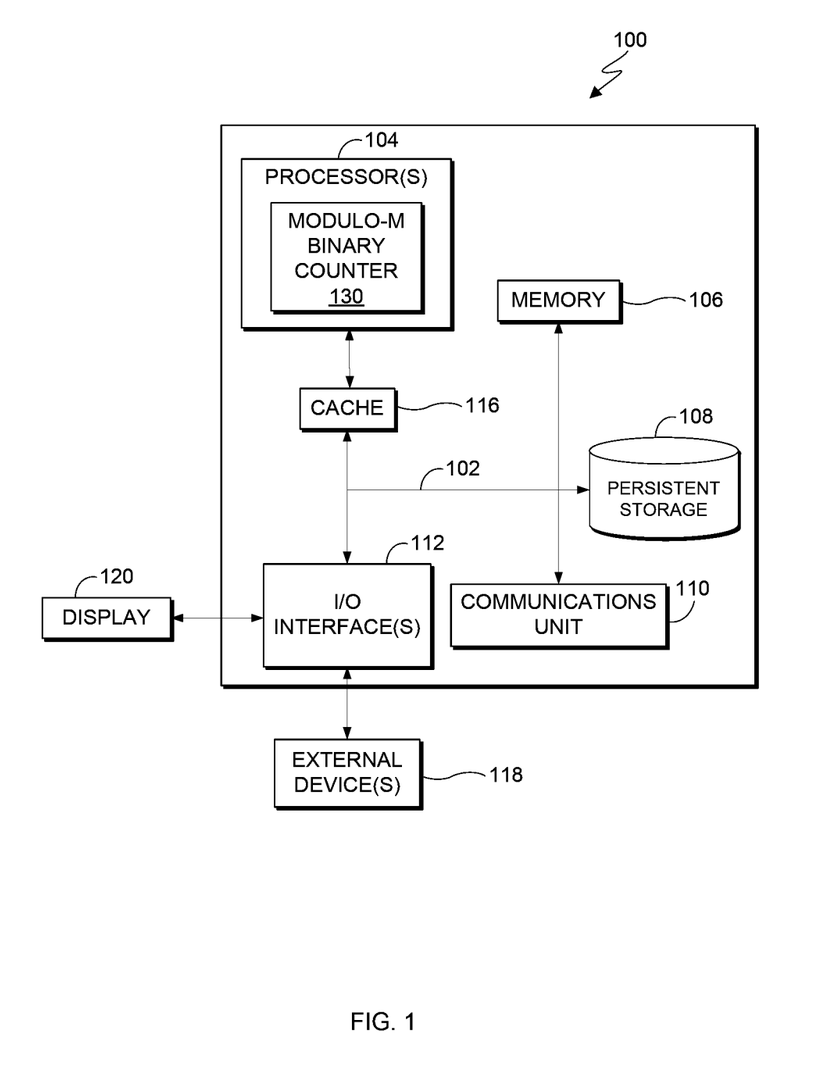
FIG. 1 is a block diagram of components of the computing device including the modulo-m binary counter, in accordance with an embodiment of the present invention.

The present invention will now be described in detail with reference to the Figures. FIG. 1 is a functional block diagram illustrating a computing environment, generally designated 100, in accordance with one embodiment of the present invention.

In general, embodiments of the present invention allow for a modulo-m binary counter (herein referred to as the "modulo-m counter", or the "counter") to be created such that the counter can be configured to wrap back to a value of zero at a modulus value "M" which can be any value and not just a power of two. Additionally, the invention allows for the counter to be increased by a value up to "N", which can have a value of any positive integer and does not have to be the number one.

In various embodiments, the invention can be used to test candidate hardware and software configurations more easily. One example of how an embodiment of the invention may be used to facilitate testing of rare situations is to decrease the size of a memory available to pointers to cause overflows more often and test the behavior which is produced upon an overflow occurring.

FIG. 1 depicts computer system 100, which is an example of a system that includes the modulo-m binary counter of embodiments of the present invention. Computer system 100 includes communications fabric 102, which provides communications between computer processor(s) 104, memory 106, persistent storage 108, communications unit 110, input/output (I/O) interface(s) 112, cache 116, and modulo-m binary counter 130. Communications fabric 102 can be implemented with any architecture designed for passing data and/or control information between processors (such as microprocessors, communications and network processors, etc.), system memory, peripheral devices, and any other hardware components within a system. For example, communications fabric 102 can be implemented with one or more buses.

Memory 106 and persistent storage 108 are computer readable storage media. In this embodiment, memory 106 includes random access memory (RAM). In general, memory 106 can include any suitable volatile or non-volatile computer readable storage media. Cache 116 is a fast memory that enhances the performance of processors 104 by holding recently accessed data and data near accessed data from memory 106.

Program instructions may be stored in persistent storage 108 for execution by one or more of the respective processors 104 via cache 116 and one or more memories of memory 106. In an embodiment, persistent storage 108 includes a magnetic hard disk drive. Alternatively, or in addition to a magnetic hard disk drive, persistent storage 108 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 108 may also be removable. For example, a removable hard drive may be used for persistent storage 108. Other examples include optical and magnetic disks, flash drives, and smart cards that are inserted into a drive for transfer onto another computer readable storage medium that is also part of persistent storage 108.

Communications unit 110, in these examples, provides for communications with other data processing systems or devices. In these examples, communications unit 110 includes one or more network interface cards. Communications unit 110 may provide communications through the use of either or both physical and wireless communications links. Program instructions and data used to practice embodiments of the present invention may be downloaded to persistent storage 108 through communications unit 110.

I/O interface(s) 112 allows for input and output of data with other devices that may be connected to each computer system. For example, I/O interface 112 may provide a connection to external devices 118 such as a keyboard, keypad, a touch screen, and/or some other suitable input device. External devices 118 can also include portable computer readable storage media such as, for example, flash drives, portable optical or magnetic disks, and memory cards. Software and data used to practice embodiments of the present invention can be stored on such portable computer readable storage media and can be loaded onto persistent storage 108 via I/O interface(s) 112. I/O interface(s) 112 can also connect to a display 120.

Display 120 provides a mechanism to display data to a user and may be, for example, a computer monitor.

In the depicted embodiment, processor(s) 104 includes modulo-m binary counter 130 which may be a set of hardware logic components capable of acting as a binary counter which wraps back to a value of zero at a given value "M", and can be increased by a value between zero and "N" each cycle. In other embodiments of the invention, modulo-m binary counter 130 may be implemented using other methods, for example, software.

Figure 2:
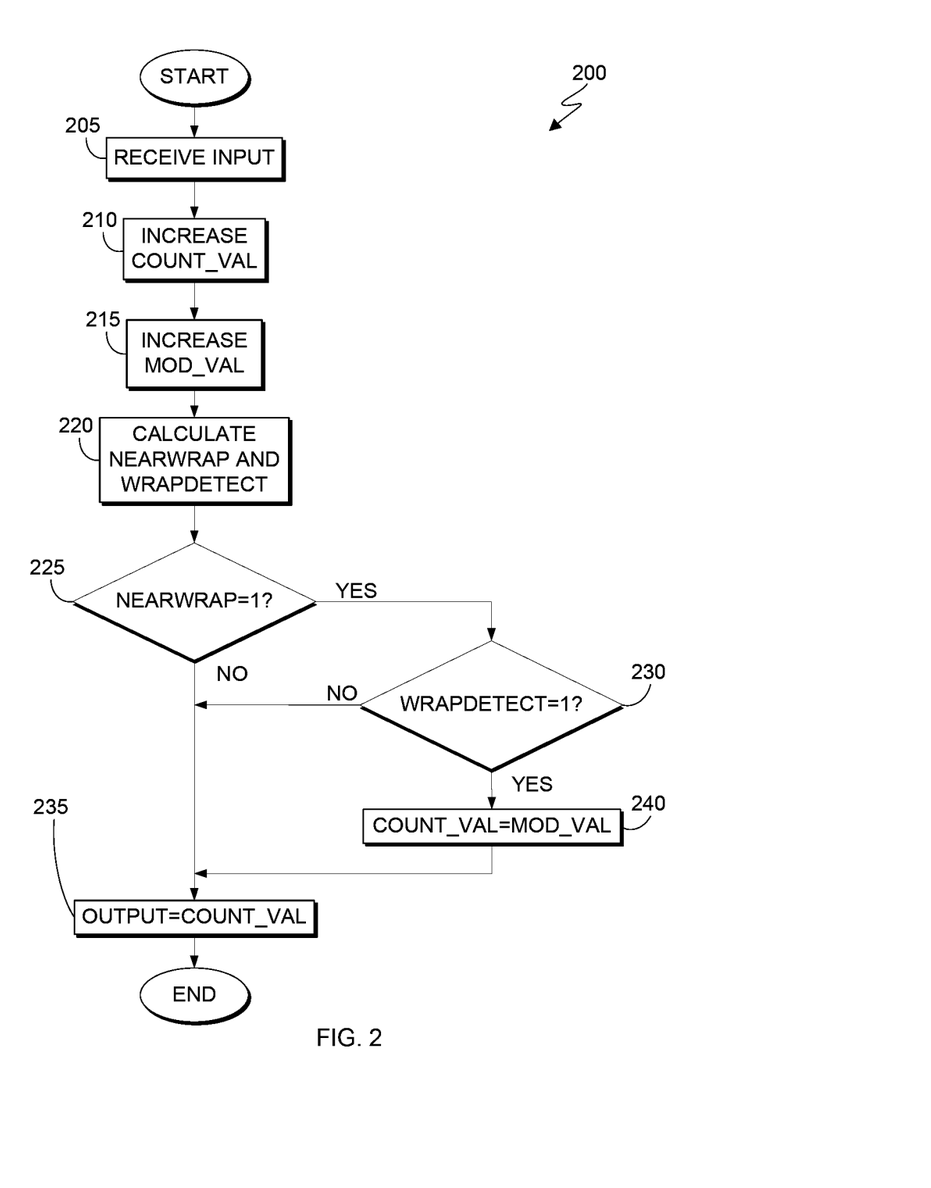
FIG. 2 is a flowchart depicting operational steps of the modulo-m binary counter, on a computing device within the data processing environment of FIG. 1, for creating a binary counter with a wrap value which is not a power of two, in accordance with an embodiment of the present invention.

FIG. 2 is a flowchart, generally designated 200, depicting the operational steps performed by modulo-m binary counter 130 each cycle, in accordance with an embodiment of the invention. In general, FIG. 2 depicts the sequence of operational steps performed by the hardware components depicted in FIG. 3.

In various embodiments, the invention is utilized to create a modulo-m binary counter which can be increased by a value up to "N" each cycle. In general, the values of "M" and "N" can be any positive integers. As discussed herein and as an example for discussion purposes only, the values of "M" and "N" are 72 and 12 respectively, such that a modulo-72 binary counter which can be increased by a value up to 12 each cycle is used.

In step 205, modulo-m binary counter 130 receives an input value, in accordance with one embodiment of the invention. In general, the input value is any positive binary value between zero and the value of "N" for the corresponding embodiment of the invention. The input value represents the value by which the counter is to be increased in the current cycle. For example, in an embodiment where the counter has a current value of 4 and the counter receives an input value of 7, the counter will then have a value of 11 after being increased. Additionally, the input value will often change from cycle to cycle in various embodiments of the invention. In one embodiment where the value of "N" is 12, the input value can range from binary values of 0000 to 1100 being, for example, 0010 in a given cycle and 1001 in the next cycle. Additionally, it should be appreciated that because the value of "N" is 12 in the depicted embodiment, four bits of data are required to be able to contain any possible input value, in accordance with this embodiment of the invention. In other embodiments where the value of "N" is a value larger than 12, more bits of data may be required to store the input value. Fewer bits of data may be required to store the input value in embodiments where the value of "N" is a value less than 12.

In step 210, the current value of the counter stored in the register COUNT_VAL is increased by the input value received in step 205. In various embodiments, the value stored in COUNT_VAL is the true value of the counter assuming that the value of the counter does not exceed the value of "M" at which the value of the counter is set to wrap back to zero. In various embodiments, the process of increasing the value stored in COUNT_VAL is accomplished using a binary adder. In embodiments where the input value includes fewer bits of data than COUNT_VAL, the input value may be modified to contain the same number of bits as COUNT_VAL. In one embodiment where a modulo-72 binary counter, which can be increased by a value between zero and 12 each cycle is used, four bits are required for the input value while seven bits of data are required for COUNT_VAL. In this embodiment, three extra bits of zeros would be appended to the left side of the input value before the input value is added to the value stored in COUNT_VAL, such that the binary value stored in the input value is unchanged and both the input value and COUNT_VAL include seven bits of data required for storing binary values between zero and 71.

In step 215, the value stored in the register MOD_VAL is increased by the input value received in step 205. In various embodiments of the invention, MOD_VAL contains an offset version of the value stored in COUNT_VAL which is designed to wrap back to zero once the value stored in COUNT_VAL reaches the desired wrap value "M". In general, the value stored in MOD_VAL is offset such that when the value stored in COUNT_VAL reaches the value of "M", the value stored in MOD_VAL reaches the next largest power of two. For example, in an embodiment where the value of "M" is 72, the value stored in MOD_VAL is designed to wrap at a value of 128, as 128 is the next power of two larger than 72. In this embodiment, in order to facilitate this, the value stored in MOD_VAL must be initialized to a value of 56, or generally the next largest power of two minus the value of "M" desired for that embodiment. Similarly to the value stored in COUNT_VAL, in various embodiments, the process of increasing the value stored in MOD_VAL is accomplished using a binary adder. In embodiments where the input value includes fewer bits of data than the value stored in MOD_VAL, the input value may be modified to include the same number of bits as the value stored in MOD_VAL. In one embodiment where a modulo-72 binary counter which can be increased by a value between zero and 12 each cycle is used, four bits of data are required for the input value while seven bits of data are required for MOD_VAL. In this embodiment, three extra bits of zeros would be appended to the left side of the input value before it is added to the value stored in MOD_VAL, such that the input value is unchanged and both the input value and MOD_VAL include seven bits of data. In other embodiments of the invention, only the last few bits of the value stored in MOD_VAL are needed for the invention to operate correctly. For example, in the embodiment where a modulo-72 binary counter, which can be increased by a value between zero and 12 each cycle is used, the invention functions correctly when only the last four bits of the value stored in MOD_VAL are used.

Figure 3:
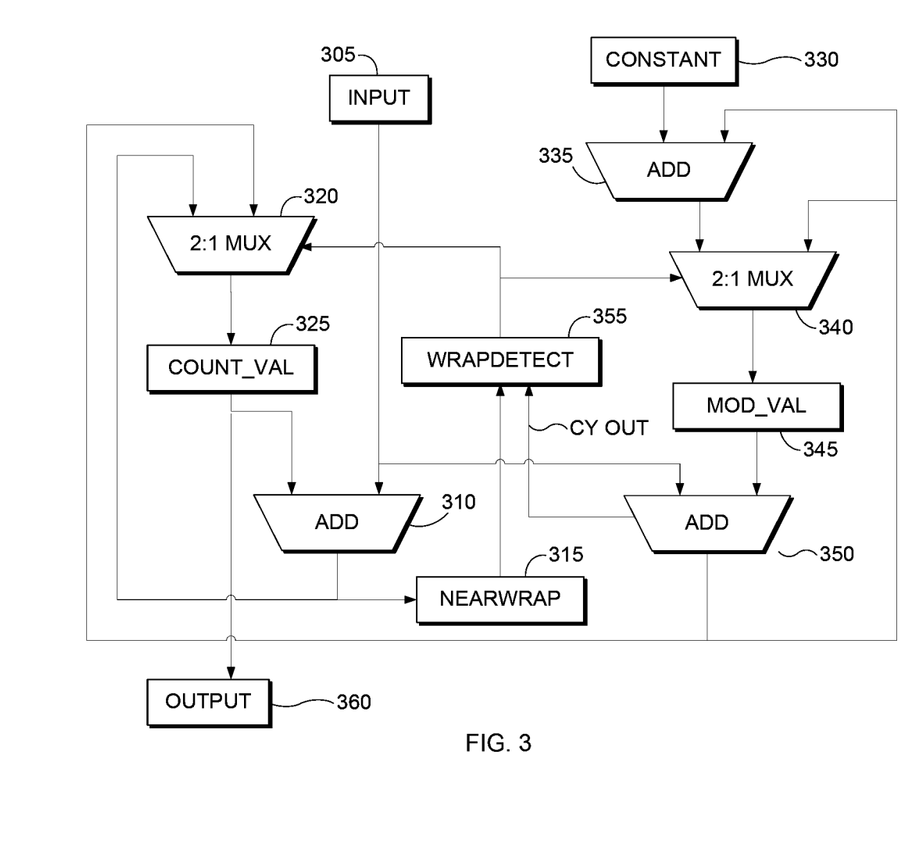
FIG. 3 is a flowchart depicting hardware logic components used to implement the modulo-m binary counter, on a computing device within the data processing environment of FIG. 1, for creating a binary counter with a wrap value which is not a power of two, in accordance with an embodiment of the present invention.

In one embodiment, the value stored in MOD_VAL and constant 330 are dynamically altered by separate controller hardware. This allows for the modulus value of modulo-m binary counter 130 to be changed, for example, from 72 to some other value, for example, 39. Modifying the modulus value of the counter is useful in the event that hardware failure prevents use of the entire memory structure the counter is referencing. Additionally, modifying the modulus value of modulo-m binary counter 130 may be useful during system testing to exacerbate testing of hardware rarely reached (such as that of cases when the memory structure becomes completely full), or may be useful as a performance testing tool to see how a future system would perform were it to be designed with a smaller array of memory (such as a case where a system would limit resources and power at the cost of performance). Various embodiments of the invention can be utilized to determine the effect on performance of changes in available resources by modifying the modulus value of modulo-m binary counter 130 by changing the value of constant 330 and altering the value stored in MOD_VAL.

In step 220, the values nearwrap and wrapdetect are calculated by modulo-m binary counter 130, in accordance with an embodiment of the invention. In general, nearwrap and wrapdetect are both binary values output by near wrap module 315 and wrap detect module 355 respectively which are used to control the behavior of modulo-m binary counter 130 when the value of modulo-m binary counter 130 approaches or reaches the value of "M" desired in a given embodiment. The value nearwrap output by near wrap module 315 having a value of 0 indicates that it is not possible for the value of the counter to reach or exceed the value of "M" in the next cycle and cause a wrap to occur. This is determined by examining whether the value of the counter exceeds a threshold determined by the value of "M" minus the largest possible value of the input ("N"). For example, in the embodiment where a modulo-72 binary counter can be increased by a value between zero and 12 each cycle, the threshold is calculated to be 72-12, or 60. In this embodiment, when the value stored in the register COUNT_VAL is 60 or greater, the value of nearwrap is calculated to be 1.

The value wrapdetect output by wrap detect module 355 is an indicator of whether or not the value stored in the register MOD_VAL has wrapped back to zero. In embodiments where the register MOD_VAL contains the same number of bits as the register COUNT_VAL, the value stored in the register MOD_VAL wrapping back to zero indicates that the value stored in the register COUNT_VAL has met or exceeded the value of "M" used in that embodiment. In general, wrapdetect having a value of 0 indicates that the value stored in the register COUNT_VAL has not reached the value of "M", and wrapdetect having a value of 1 indicates that the value stored in the register COUNT_VAL has reached or exceeded the value of "M" and wrapped back to zero. In some embodiments, only the last "K" bits of the MOD_VAL register are present, where "K" is the number of bits present in the input value. For example, in the embodiment where a modulo-72 binary counter which can be increased by a value between zero and 12 each cycle is used, because the input only contains four bits of data each cycle, the register MOD_VAL only needs to store the last four bits of data to operate correctly. Storing only the last "K" bits of data allows for less data to be utilized in implementing the invention but causes the MOD_VAL register to wrap more often, and for the wrapdetect value to be set to 1 more frequently, and at times when the value stored in the COUNT_VAL register has not yet reached the value of "M". Using the values nearwrap and wrapdetect in conjunction with each other allows for the invention to be implemented successfully. Because the input value and the register MOD_VAL both contain "K" bits, in such embodiments, wrapdetect can be set to a value of 1 only once while nearwrap also has a value of 1, indicating that the value stored in COUNT_VAL has reached or exceeded the value of "M".

In decision step 225, modulo-m binary counter 130 examines the value of nearwrap and based on the value of nearwrap determines whether it is possible that the value stored in the register COUNT_VAL has reached or exceeded the value of "M". If nearwrap has a value of 1 (decision step 225, yes branch), then modulo-m binary counter 130 proceeds to examine the value of wrapdetect in decision step 230. The reason that wrapdetect must be examined next is that nearwrap indicates that it is possible that the value stored in COUNT_VAL has reached or exceeded the value of "M", but more information is required to determine if the value of "M" has truly been reached. If nearwrap has a value of 0 (decision step 225, no branch), then modulo-m binary counter 130 returns the value stored in COUNT_VAL as the output for that cycle in step 235. In this case, the value stored in COUNT_VAL is used because modulo-m binary counter 130 has determined that it is not possible for the value of COUNT_VAL to have reached or exceeded the value of "M", and as a result no wrapping is needed.

In decision step 230, modulo-m binary counter 130 examines the value of wrapdetect output by wrap detect module 355 to determine if the value stored in the register COUNT_VAL has reached or exceeded the value of "M". If the value of wrapdetect is 0 (decision step 230, no branch), then modulo-m binary counter 130 proceeds to return the value stored in the register COUNT_VAL as the output for that cycle in step 235. In this case, modulo-m binary counter 130 determined that the value stored in the register COUNT_VAL is close to the value of "M", but has not reached or exceeded the value of "M". As a result, no wrapping is necessary for that cycle and the value stored in the register COUNT_VAL is used as the output. If the value of wrapdetect is 1 (decision step 230, yes branch), then modulo-m binary counter 130 proceeds to replace the value stored in the register COUNT_VAL with the value stored in the register MOD_VAL in step 240. When modulo-m binary counter 130 detects that the value of wrapdetect is 1, the value stored in the register COUNT_VAL has reached or exceeded the value of "M", so as a result, the wrapped value stored in the register MOD_VAL is used as the output for that cycle. For example, in an embodiment where a modulo-72 binary counter, which can be increased by a value between zero and 12 each cycle is used, COUNT_VAL has a value of 67 while MOD_VAL has a value of 11. In one embodiment, the counter is increased by a value of 10 in the current cycle, and as a result COUNT_VAL is increased to a value of 77 while MOD_VAL is increased by 10 and wraps back to a value of 5. Because MOD_VAL only contains four bits of data, MOD_VAL naturally wraps back to a value of zero once it reaches a value of 16. In this embodiment, the wrapping of the value stored in MOD_VAL results in a change in the stored value from 11 to 5 as the counter is increased by 10, as 11+10=21, and 21 modulo-16=5. Further, in this embodiment, both nearwrap and wrapdetect would have values of 1, so the value of 5 stored in the register MOD_VAL would be written to the register COUNT_VAL and used as the output value for that cycle. When this occurs, the previous value of 77 present in the register COUNT_VAL is discarded due to the fact that there is no use for values greater than 71 in a modulo-72 counter. Additionally, step 240 includes the process of re-initializing the value stored in the register MOD_VAL to the sum of the constant previously used and the current value of the register MOD_VAL after a wrap occurs, as described in greater detail with respect to FIG. 3.

FIG. 3 is a block diagram depicting the various hardware logic components used to implement a modulo-m binary counter such as modulo-m binary counter 130, in accordance with one embodiment of the invention.

Input 305 is the input received by modulo-m binary counter 130 for that cycle, representing a value between zero and "N" which modulo-m binary counter 130 is to be increased by. In various embodiments, the number of bits ("K") required for the input value changes depending on the value of "N" required for that embodiment such that N is less than or equal to $2^K$. For example, in an embodiment where the value of "N" is 12, four bits of data are required to identify any integer value between zero and 12. It should be appreciated by one skilled in the art that larger or smaller numbers of bits may be required in embodiments where the value of "N" is larger or smaller.

Adder 310 is a binary adder capable of receiving two or more binary values and returning an output equal to the sum of the received values. For example, in an embodiment where adder 310 receives the values 10011 (19) and 00100 (4), adder 310 outputs 10111 (23) as a result. In general, adder 310 is used to increase the value stored in the register COUNT_VAL by the value represented in input 305. In cases where the value stored in the register COUNT_VAL does not reach or exceed the value of "M", adder 310 performs the operation of increasing modulo-m binary counter 130. In some embodiments, adder 310 requires that each of the inputs contain the same number of bits of data in order for the adder to function properly. In such embodiments, additional concatenation elements (not depicted) may be present which append additional zeroes onto the input value such that the input value contains the same number of bits as the value stored in the register COUNT_VAL. In general, if input 305 contains "K" bits of data, and COUNT_VAL contains "Y" bits of data, a total of Y-K zeroes will be appended to the left side of the input value in these embodiments. For example, in an embodiment where input 305 contains four bits of data, COUNT_VAL contains seven bits of data, and the value 1001 (9) is received as input 305, appending three zeroes onto the left side of input 305 would yield a value of 0001001 (9) thus changing the number of bits present but not changing the value of input 305.

Near wrap module 315 is a collection of hardware logic elements which receive the current value stored in the register COUNT_VAL and output a nearwrap value of either zero or one for that given cycle based on the received input. In general, near wrap module 315 outputting a nearwrap value of one indicates that the difference between the value stored in the register COUNT_VAL and "M" is less than or equal to the value of "N", in accordance with an embodiment of the invention. As a result of this, it is possible for the value of modulo-m binary counter 130 to reach or exceed the value of "M" in that cycle once modulo-m binary counter 130 is increased by the value of input 305. For example, in an embodiment where a modulo-72 binary counter, which can be increased by a value between zero and 12 each cycle is used, nearwrap module 315 outputs a nearwrap value of one in any cycle where the value stored in the register COUNT_VAL is greater than or equal to 60, and outputs a nearwrap value of zero for any cycle where the value stored in the register COUNT_VAL is less than 60.

Multiplexer 320 is a collection of hardware logic components capable of selecting and outputting one of two inputs based on the value of a third input received from wrap detect module 355, in accordance with an embodiment of the invention. In the depicted embodiment, a first input to multiplexer 320 is received from adder 350, which outputs the increased value stored in the register MOD_VAL 345 for that cycle. A second input to multiplexer 320 is received from adder 310 which outputs the increased value stored in the register COUNT_VAL 325 for that cycle. In accordance with the depicted embodiment, multiplexer 320 outputs the value received from adder 310 when the value received from wrap detect module 355 is equal to zero and outputs the value received from adder 350 when the value received from wrap detect module 355 is equal to one.

COUNT_VAL register 325 is a register which stores the current value of modulo-m binary counter 130, in accordance with an embodiment of the invention. COUNT_VAL register 325 outputs the current value of modulo-m binary counter 130 to adder 310 and output 360 once each cycle. Additionally, COUNT_VAL register 325 receives a value from multiplexer 320 once each cycle which is used to update the value of COUNT_VAL register 325 for that cycle. In general, a value received from multiplexer 320 in a given cycle is outputted by COUNT_VAL register 325 in the following cycle. It should be appreciated that the number of bits of data which COUNT_VAL register 325 contains will vary between various embodiments of the invention depending on the value of "M" at which modulo-m binary counter 130 wraps in each embodiment.

Constant 330 is a value used to initialize MOD_VAL register 345. In various embodiments of the invention, MOD_VAL register 345 stores an offset version of the value stored in COUNT_VAL register 325 which is designed to wrap back to zero once the value stored in COUNT_VAL register 325 reaches the desired wrap value "M". In general, the value stored in MOD_VAL register 345 is offset such that when the value stored in COUNT_VAL register 325 reaches the value of "M", the value stored in MOD_VAL register 345 reaches the next largest power of two. For example, in the embodiment where the value of "M" is 72, MOD_VAL is designed to wrap at a value of 128, as 128 is the first power of two larger than 72. In this embodiment, in order to facilitate this, the value stored in MOD_VAL register 345 must be initialized to a value of 56 (128 minus 72), or generally the next largest power of two minus the value of "M" desired for that embodiment. In general, constant 330 is the value which MOD_VAL register 345 must be initialized to in order for the value stored in MOD_VAL register 345 to wrap properly once the value stored in COUNT_VAL register 325 reaches or exceeds the value of "M".

Adder 335 is a binary adder capable of receiving two or more binary values and returning an output equal to the sum of the received values. For example, in an embodiment where adder 335 receives the values 10011 (19) and 00100 (4), adder 335 outputs 10111 (23) as a result. In general, adder 335 is used for properly initializing the value stored in MOD_VAL register 345 when a wrap occurs. In the depicted embodiment, constant 330 is added to the value stored in MOD_VAL register 345 for that current cycle, and the output is used to set the value stored in MOD_VAL register 345 for the next cycle after a wrap occurs.

Multiplexer 340 is a collection of hardware logic components capable of selecting and outputting one of two inputs based on the value of a third input received from wrap detect module 355, in accordance with an embodiment of the invention. In the depicted embodiment, a first input to multiplexer 340 is received from adder 335, and a second input to multiplexer 340 is received from adder 350. In the depicted embodiment, multiplexer 340 controls which input is used to update the value stored in MOD_VAL register 345 for a given cycle. In general, the value received from adder 350 represents an increased version of the value stored in MOD_VAL register 345 for the previous cycle and is needed when a wrap has not occurred. Additionally, the value received from adder 335 represents the sum of the output of adder 350 and constant 330, which is needed to re-initialize the value of MOD_VAL register 345 each time that a wrap occurs. In accordance with the depicted embodiment, multiplexer 320 outputs the value received from adder 350 when the value received from wrap detect module 355 is equal to zero and outputs the value received from adder 335 when the value received from wrap detect module 355 is equal to one.

MOD_VAL register 345 is a register which stores the current offset value of modulo-m binary counter 130 which is designed to wrap back to zero when the value stored in COUNT_VAL register 325 reaches the value of "M", in accordance with an embodiment of the invention. MOD_VAL register 345 outputs the current value of modulo-m binary counter 130 to adder 350 once each cycle. Additionally, MOD_VAL register 345 receives a value from multiplexer 340 once each cycle which is used to update the value of MOD_VAL register 345 for that cycle. In general, a value received from multiplexer 340 in a given cycle is outputted by MOD_VAL register 325 in the following cycle (where the value output by MOD_VAL register 345 is the value received from multiplexer 340 in the previous cycle). It should be appreciated that in some embodiments, the number of bits of data which MOD_VAL register 325 contains will vary based on specific details of each embodiment, such as the value of "M" at which modulo-m binary counter 130 wraps in a given embodiment. In other embodiments, MOD_VAL register 345 contains the same number of bits as input 305, generally referred to as "K" bits, such as in the depicted embodiment of the invention where both input 305 and MOD_VAL register 345 contain 4 bits of data.

Adder 350 is a binary adder capable of receiving two or more binary values and returning an output equal to the sum of the received values. For example, in an embodiment where adder 350 receives the values 10011 (19) and 00100 (4), adder 350 outputs 10111 (23) as a result. In general, adder 350 is used to increase the value stored in the register MOD_VAL by the value represented in input 305. In some embodiments, adder 350 requires that each of the inputs contain the same number of bits of data in order for adder 350 to function properly. In such embodiments, additional concatenation elements (not depicted) may be present which append additional zeroes onto the left side of input 305 such that input 305 contains the same number of bits as the value stored in MOD_VAL register 345. In general, if input 305 contains "K" bits of data, and MOD_VAL register 345 contains "Y" bits of data, a total of Y-K zeroes will be appended to the left side of input 305 in this embodiment. For example, in an embodiment where input 305 contains four bits of data, MOD_VAL register 325 contains seven bits of data, and the value 1001 (9) is received as input 305, appending three zeroes onto the left side of input 305 would yield a value of 0001001 (9) thus changing the number of bits present to match the number of bits present in MOD_VAL register 345 but not changing the value of input 305. In the depicted embodiment, due to the fact that both MOD_VAL register 345 and input 305 contain four bits of data, no concatenation elements are required. In various embodiments, when the value stored in MOD_VAL register 345 wraps back to zero, a carry output is present for that cycle indicating that the value stored in MOD_VAL register 345 has wrapped, but MOD_VAL register 345 does not have enough room to store the additional bit of data. As depicted in FIG. 3, this carry output (CY OUT) is sent to wrap detect module 355 where it is later used to determine the wrapdetect value for that cycle.

It should be appreciated that in embodiments where MOD_VAL register 345 includes "K" bits of data, where COUNT_VAL register 325 includes more than "K" bits of data, adders 335 and 350 will be used to add values containing only "K" bits of data. In embodiments where a wrap occurs, both adder 335 and adder 350 are used in series, and because adder 335 and adder 350 add values containing only "K" bits of data, the process completes more quickly than in embodiments where MOD_VAL register 345 includes the same number of bits of data as COUNT_VAL register 325.

Wrap detect module 355 is a collection of hardware logic components which receive a nearwrap value from near wrap module 315 and the carry output value from adder 350 and outputs a wrapdetect value to multiplexers 320 and 340. In general, wrap detect module 355 outputs a wrapdetect value of one for a given cycle when both the nearwrap value received from near wrap module 315 has a value of one and a carry output is received from adder 350. If either or both of these criteria are not met, then wrap detect module 355 outputs a wrapdetect value of zero for that cycle.

Output 360 represents a value returned from COUNT_VAL register 325 once each cycle representing the current value of modulo-m binary counter 130 after being increased by the value of input 305 received in the previous cycle. In general, output 360 includes the same number of bits of data as COUNT_VAL register 325.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of implementing a modulo binary counter, the method comprising:
    receiving an input value, wherein the input value is an amount which a current value of the modulo binary counter stored in a first register is to be increased, wherein the current value of the modulo binary counter is greater than or equal to zero and less than a modulus value of the modulo binary counter;
    increasing the current value of the modulo binary counter and an offset value of the modulo binary counter stored in a second register by the input value, wherein the offset value of the modulo binary counter is equal to the sum of the current value stored in the first register and a constant;
    determining that the current value of the modulo binary counter is greater than or equal to the modulus value of the binary counter;
    replacing the current value of the modulo binary counter stored in the first register with an updated offset value of the modulo binary counter, wherein the updated offset value is the offset value of the modulo binary counter increased by the input value; and
    returning the updated offset value of the modulo binary counter stored in the first register.

2. The method of claim 1, wherein the input value is greater than or equal to zero and less than or equal to an input value limit.

3. The method of claim 1, wherein the modulus value of the modulo binary counter is a value that is not equal to a power of two; and
    wherein the modulus value of the modulo binary counter is altered by modifying the constant.

4. The method of claim 1, wherein the constant is equal to the first power of two greater than the modulus value minus the modulus value.

5. The method of claim 2, further comprising:
determining that the current value of the modulo binary counter is greater than or equal to a threshold value, wherein the threshold value is equal to the modulus value minus the input value limit; and
wherein determining that the current value of the modulo binary counter is greater than or equal to the modulus value of the binary counter comprises determining that the offset value of the modulo binary counter has reached or exceeded the first power of two greater than the modulus value.

6. The method of claim 2, wherein the offset value of the modulo binary counter contains the same number of bits of data necessary to store the input value limit.

7. The method of claim 1, further comprising:
replacing the offset value of the modulo binary counter stored in the second register with the sum of the updated offset value of the modulo binary counter and the constant.

8. A computer program product for implementing a modulo binary counter, the computer program product comprising:
one or more computer readable storage media and program instructions stored on the one or more computer readable storage media, the program instructions comprising:
program instructions to receive an input value, wherein the input value is an amount which a current value of the modulo binary counter stored in a first register is to be increased, wherein the current value of the modulo binary counter is greater than or equal to zero and less than a modulus value of the modulo binary counter;
program instructions to increase the current value of the modulo binary counter and an offset value of the modulo binary counter stored in a second register by the input value, wherein the offset value of the modulo binary counter is equal to the sum of the current value stored in the first register and a constant;
program instructions to determine that the current value of the modulo binary counter is greater than or equal to the modulus value of the binary counter;
program instructions to replace the current value of the modulo binary counter stored in the first register with an updated offset value of the modulo binary counter, wherein the updated offset value is the offset value of the modulo binary counter increased by the input value; and
program instructions to return the updated offset value of the modulo binary counter stored in the first register.

9. The computer program product of claim 8, wherein the input value is greater than or equal to zero and less than or equal to an input value limit.

10. The computer program product of claim 8, wherein the modulus value of the modulo binary counter is a value that is not equal to a power of two; and
wherein the modulus value of the modulo binary counter is altered by modifying the constant.

11. The computer program product of claim 8, wherein the constant is equal to the first power of two greater than the modulus value minus the modulus value.

12. The computer program product of claim 9, further comprising:
program instructions to determine that the current value of the modulo binary counter is greater than or equal to a threshold value, wherein the threshold value is equal to the modulus value minus the input value limit; and
wherein program instructions to determine that the current value of the modulo binary counter is greater than or equal to the modulus value of the binary counter comprises determining that the offset value of the modulo binary counter has reached or exceeded the first power of two greater than the modulus value.

13. The computer program product of claim 9, wherein the offset value of the modulo binary counter contains the same number of bits of data necessary to store the input value limit.

14. The computer program product of claim 8, further comprising:
program instructions to replace the offset value of the modulo binary counter stored in the second register with the sum of the updated offset value of the modulo binary counter and the constant.

15. A computer system for implementing a modulo binary counter, the computer system comprising:
one or more computer processors, one or more computer readable storage media, and program instructions stored on the computer readable storage media for execution by at least one of the one or more processors, the program instructions comprising:
program instructions to receive an input value, wherein the input value is an amount which a current value of the modulo binary counter stored in a first register is to be increased, wherein the current value of the modulo binary counter is greater than or equal to zero and less than a modulus value of the modulo binary counter;
program instructions to increase the current value of the modulo binary counter and an offset value of the modulo binary counter stored in a second register by the input value, wherein the offset value of the modulo binary counter is equal to the sum of the current value stored in the first register and a constant;
program instructions to determine that the current value of the modulo binary counter is greater than or equal to the modulus value of the binary counter;
program instructions to replace the current value of the modulo binary counter stored in the first register with an updated offset value of the modulo binary counter, wherein the updated offset value is the offset value of the modulo binary counter increased by the input value; and
program instructions to return the updated offset value of the modulo binary counter stored in the first register.

16. The computer system of claim 15, wherein the input value is greater than or equal to zero and less than or equal to an input value limit.

17. The computer system of claim 15, wherein the modulus value of the modulo binary counter is a value that is not equal to a power of two; and
wherein the modulus value of the modulo binary counter is altered by modifying the constant.

18. The computer system of claim 15, wherein the constant is equal to the first power of two greater than the modulus value minus the modulus value.

19. The computer system of claim 16, further comprising:
program instructions to determine that the current value of the modulo binary counter is greater than or equal to a threshold value, wherein the threshold value is equal to the modulus value minus the input value limit; and
wherein program instructions to determine that the current value of the modulo binary counter is greater than or equal to the modulus value of the binary counter comprises determining that the offset value of the modulo binary counter has reached or exceeded the first power of two greater than the modulus value.

20. The computer system of claim 16, wherein the offset value of the modulo binary counter contains the same number of bits of data necessary to store the input value limit.

* * * * *